United States Patent
Jang et al.

(10) Patent No.: US 12,408,378 B2
(45) Date of Patent: Sep. 2, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 569 days.

(21) Appl. No.: 17/842,103

(22) Filed: Jun. 16, 2022

(65) Prior Publication Data

US 2023/0131153 A1 Apr. 27, 2023

Related U.S. Application Data

(63) Continuation of application No. PCT/CN2022/074019, filed on Jan. 26, 2022.

(30) Foreign Application Priority Data

Oct. 25, 2021 (CN) .......................... 202111243341.8

(51) Int. Cl.
H10D 30/67 (2025.01)
H10B 12/00 (2023.01)
H10D 30/01 (2025.01)

(52) U.S. Cl.
CPC ......... *H10D 30/6735* (2025.01); *H10B 12/30* (2023.02); *H10B 12/482* (2023.02); *H10D 30/031* (2025.01); *H10D 30/6757* (2025.01)

(58) Field of Classification Search
None
See application file for complete search history.

(56) References Cited

U.S. PATENT DOCUMENTS 4,698,654 A 10/1987 Kohn
5,929,477 A 7/1999 McAllister Burns, Jr.
(Continued)

FOREIGN PATENT DOCUMENTS

CN 101604705 A 12/2009
CN 109461738 A 3/2019
(Continued)

OTHER PUBLICATIONS

Supplementary European Search Report in the European application No. 22734084.1, mailed on Nov. 22, 2023, 8 pages.

*Primary Examiner* — Hung K Vu
(74) *Attorney, Agent, or Firm* — Kilpatrick Townsend & Stockton LLP

(57) ABSTRACT

A semiconductor structure includes: a base, including bit lines extending in a first direction and semiconductor channels on the bit lines that are respectively arranged at intervals, in which a semiconductor channel includes a first region, a second region and a third region arranged in sequence; a dielectric layer, located between two adjacent ones of the bit lines and on a surface of the semiconductor channel; a first gate layer, surrounding the dielectric layer of the second region and extending in a second direction; a second gate layer, surrounding the dielectric layer of the third region, which is spaced apart from the first gate layer in the direction perpendicular to the top surface of the bit line; and an insulation layer, located between the adjacent semiconductor channels on the same bit line and isolating the first gate layers and the second gate layers on the adjacent dielectric layers.

19 Claims, 18 Drawing Sheets

(56) References Cited

U.S. PATENT DOCUMENTS

| | | |
|---|---|---|
| 10,181,472 B1 | 1/2019 | Huang |
| 2007/0007601 A1 | 1/2007 | Hsu |
| 2009/0096000 A1* | 4/2009 | Juengling ............... H10B 12/34 |
| | | 257/302 |
| 2011/0121396 A1* | 5/2011 | Lee ........................ G11C 11/403 |
| | | 257/E29.264 |
| 2012/0119286 A1 | 5/2012 | Kim |
| 2017/0162583 A1* | 6/2017 | Lee ................... H01L 21/02606 |
| 2018/0061460 A1* | 3/2018 | Ingalls ................. H10D 30/025 |
| 2019/0074363 A1 | 3/2019 | Zhu |
| 2021/0083050 A1 | 3/2021 | Hussain et al. |

FOREIGN PATENT DOCUMENTS

| | | |
|---|---|---|
| CN | 109712976 B | 2/2021 |
| CN | 113053943 A | 6/2021 |
| CN | 113299555 A | 8/2021 |
| WO | 2019139622 A1 | 7/2019 |

* cited by examiner

SEMICONDUCTOR STRUCTURE AND METHOD FOR MANUFACTURING SAME

CROSS-REFERENCE TO RELATED APPLICATIONS

This application is a continuation application of International Application No.: PCT/CN2022/074019, filed on Jan. 26, 2022, which claims priority to Chinese Patent Application No. 202111243341.8, filed on Oct. 25, 2021. The disclosures of International Application No.: PCT/CN2022/074019 and Chinese Patent Application No. 202111243341.8 are hereby incorporated by reference in their entireties.

BACKGROUND

As the integration density of dynamic memories is developing higher and higher, while the arrangement of transistors in a dynamic memory array structure and how to reduce a size of a single functional device in the dynamic memory array structure are studied, it is also necessary to consider the influence of small-sized functional devices on the overall electrical properties of a semiconductor structure.

When a vertical gate-all-around (GAA) transistor structure is used as a dynamic memory access transistor, an occupied area may reach 4F2 (F: a minimum pattern size that can be obtained under a given process condition). In principle, higher density efficiency may be achieved. However, due to the small interval between the adjacent small-sized functional devices, the interaction effect between adjacent functional devices is not easy to control, which affects the overall electrical properties of the semiconductor structure.

SUMMARY

Embodiments of the disclosure relate to the field of semiconductors, and in particular, to a semiconductor structure and a method for manufacturing the semiconductor structure.

Embodiments of the disclosure provide a semiconductor structure and a method for manufacturing the same.

An aspect of an embodiment of the disclosure provides a semiconductor structure. The semiconductor structure includes: a base, including bit lines and semiconductor channels that are respectively arranged at intervals, in which a bit line extend in a first direction, a semiconductor channel is located on partial top surface of the bit line, and in a direction perpendicular to the top surface of the bit line, and the semiconductor channel includes a first region, a second region and a third region arranged in sequence; a dielectric layer, located between two adjacent ones of the bit lines and on a surface of the semiconductor channel; a first gate layer, surrounding the dielectric layer of the second region and extending in a second direction, in which the first direction is different from the second direction; a second gate layer, surrounding the dielectric layer of the third region, in which, in the direction perpendicular to the top surface of the bit line, the second gate layer is spaced apart from the first gate layer; and an insulation layer, located between two adjacent ones of the semiconductor channels on the same bit line and isolating the first gate layers and the second gate layers on two adjacent ones of the dielectric layers.

According to some embodiments of the disclosure, another aspect of an embodiment of the disclosure further provides a method for manufacturing a semiconductor structure. The method includes: providing a base, including bit lines and semiconductor channels that are respectively arranged at intervals, in which a bit line extends in a first direction, a semiconductor channel is located on partial top surface of the bit line, and in a direction perpendicular to a top surface of the bit line, and the semiconductor channel includes a first region, a second region and a third region arranged in sequence; forming a dielectric layer, in which the dielectric layer is located between two adjacent ones of the bit lines and on a surface of the semiconductor channel; forming a first gate layer, in which the first gate layer surrounds the dielectric layer of the second region; forming a second gate layer, in which the second gate layer surrounds the dielectric layer of the third region and in the direction perpendicular to the top surface of the bit line, and the second gate layer is spaced apart from the first gate layer; and forming an insulation layer, where the insulation layer is located between two adjacent ones of the semiconductor channels on the same bit line.

BRIEF DESCRIPTION OF THE DRAWINGS

One or more embodiments are exemplified by the figures in the corresponding drawings, and these exemplary descriptions do not constitute limitations of the embodiments. Unless otherwise stated, the figures in the drawings do not constitute a scale limitation.

DETAILED DESCRIPTION

It is to be known from the Background that, the electrical properties of the semiconductor structure needs to be improved.

In a GAA transistor structure in the related art, a semiconductor channel corresponds to a gate layer. The turn-on or turn-off of the semiconductor channel is controlled by applying a voltage to the gate layer. However, in order to achieve a higher integration density, spacing between a gate electrode layer and a semiconductor layer is reduced, and a size of the gate electrode layer is also decreased, both of which increases gate-induced drain leakage (GIDL), and the turn-on/turn-off ratio of the semiconductor channel is reduced. As a result, it is difficult for the gate electrode layer to control the turn-off of the semiconductor channel, resulting in reduction of the electrical properties of the semiconductor structure.

Embodiments of the disclosure are described in detail below with reference to the drawings. It is to be understood by those skilled in the art that, in each embodiment of the disclosure, many technical details are provided for readers to better understand the disclosure. However, even without these technical details and various changes and modifications based on the following embodiments, the technical solutions claimed in the disclosure can also be realized.

Figure 1:
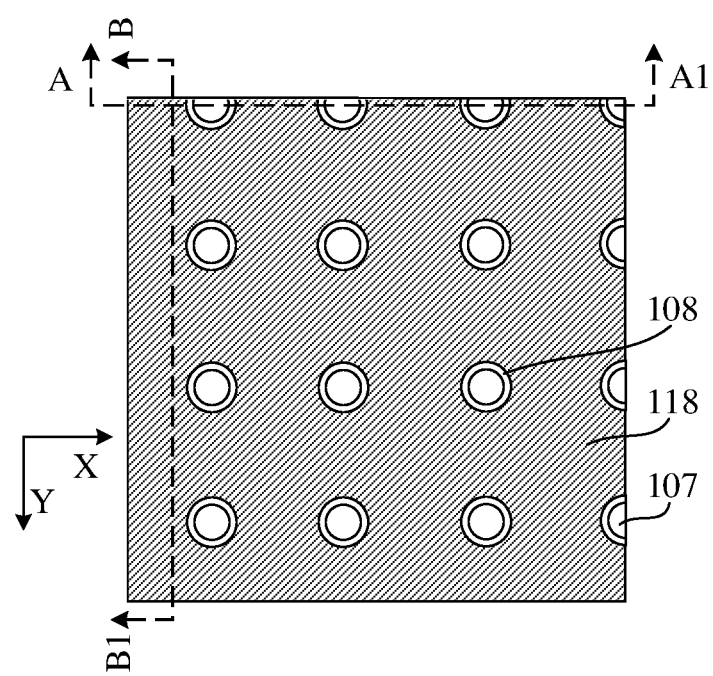
FIG. 1 to FIG. 4 are structural schematic diagrams corresponding to a semiconductor structure according to an embodiment of the disclosure.
Figure 2:
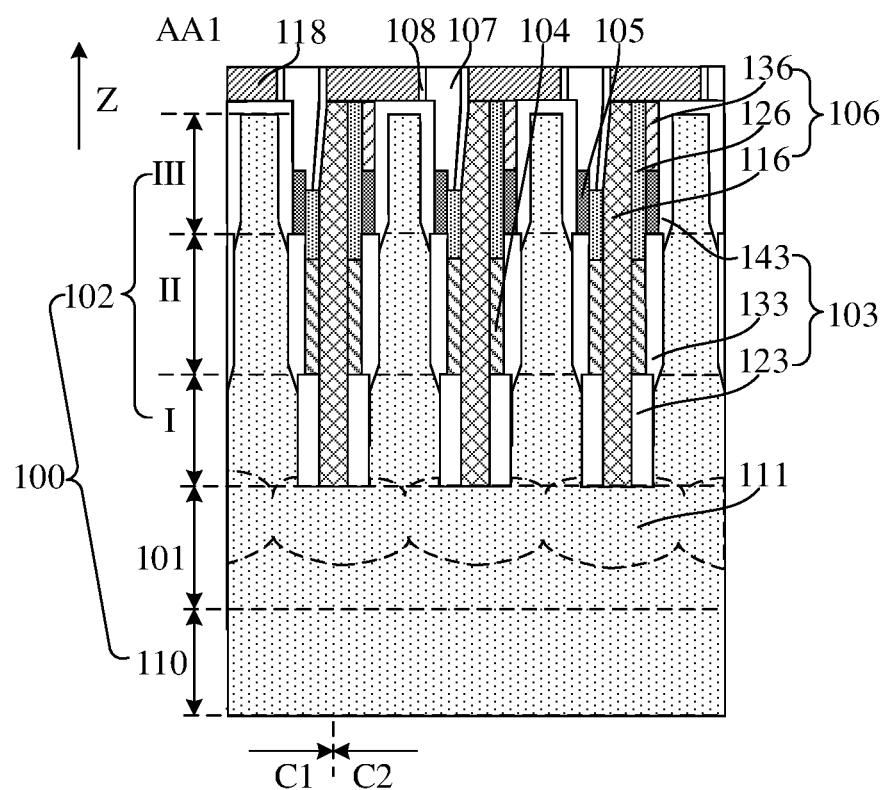
Figure 3:
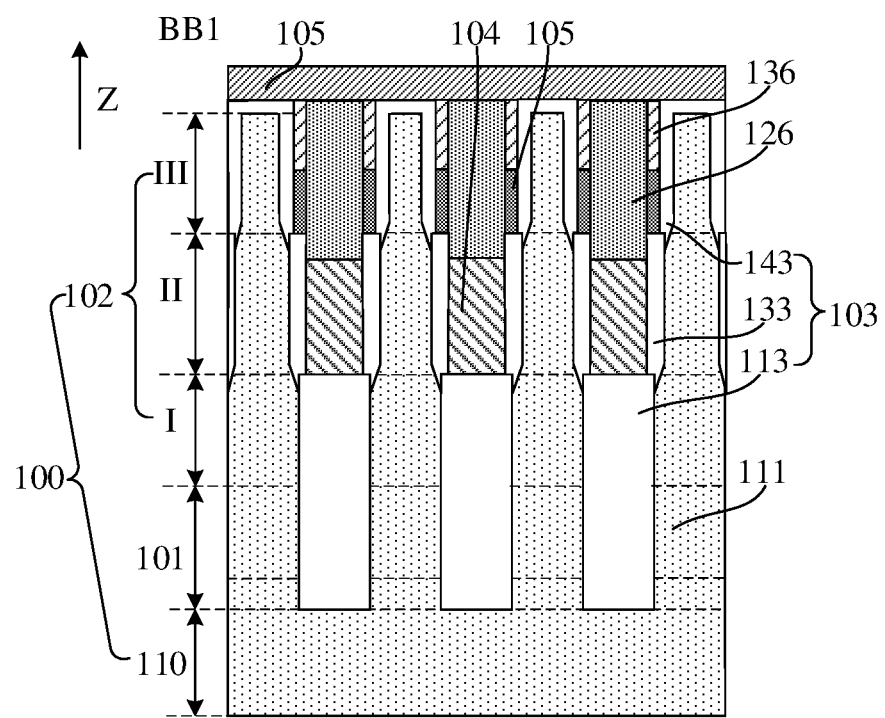
Figure 4:
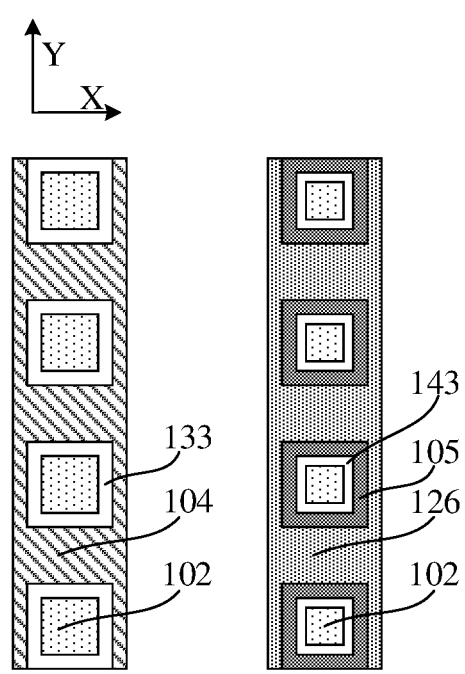

An embodiment of the disclosure provides a semiconductor structure. The semiconductor structure provided in this embodiment of the disclosure is described in detail below with reference to the drawings. FIG. 1 to FIG. 4 are structural schematic diagrams corresponding to a semiconductor structure according to an embodiment of the disclosure. FIG. 1 is a schematic top view of a semiconductor structure according to an embodiment of the disclosure. FIG. 2 is a schematic cross-sectional view of the semiconductor structure shown in FIG. 1 in the first cross-sectional direction AA1. FIG. 3 is a schematic cross-sectional view of the semiconductor structure shown in FIG. 1 in the second cross-sectional direction BB1. FIG. 4 is a schematic cross-sectional view of a semiconductor structure in which a first gate layer surrounds a semiconductor channel and a second gate layer surrounds the semiconductor channel.

Referring to FIG. 1 to FIG. 4, the semiconductor structure includes: a base 100, including bit lines 101 and semiconductor channels 102 that are respectively arranged at intervals, in which each bit line 101 extends in a first direction X, each semiconductor channel 102 is located on partial top surface of a bit line 101, and in a direction Z perpendicular to the top surface of the bit line 101, the semiconductor channel 102 includes a first region I, a second region II, and a third region III that are arranged in sequence; dielectric layers 103, each located between adjacent ones of the bit lines 101 and on the surface of a semiconductor channel 102; first gate layers 104, each surrounding the dielectric layer 103 of the second region II and extending in a second direction Y, in which the first direction X is different from the second direction Y; second gate layers 105, each surrounding the dielectric layer 103 of the third region III, in which, in the direction perpendicular to the top surface of the bit line 101, the second gate layer 105 is spaced apart from the first gate layer 104; and insulation layers 106, each located between two adjacent ones of the semiconductor channels 102 on a same bit line 101 and isolating the first gate layers 104 and the second gate layers 105 on two adjacent ones of the dielectric layers 103.

A vertical GAA transistor is constituted by a semiconductor channel 102, a dielectric layer 103 surrounding the sidewall of the semiconductor channel 102, a first gate layer 104, and a second gate layer 105. The base 100 includes a substrate 110. A bit line 101 is located between the substrate 110 and the GAA transistor. Therefore, a 3D stacked semiconductor structure can be formed, and the integration density of the semiconductor structure is increased.

It is to be noted that, both the first region I and the third region III may be used as a source or a drain of the GAA transistor. Both the first gate layer 104 and the second gate layer 105 are configured to control turn-on or turn-off of the GAA transistor.

In some embodiments, continuously referring to FIG. 1, the first direction X is perpendicular to the second direction Y, so that the semiconductor channels 102 present an arrangement mode of 4F2 (F: a minimum pattern size that can be obtained under a given process condition). Therefore, the integration density of the semiconductor structure is increased. In other embodiments, the first direction intersects with the second direction, and an included angle between the first direction and the second direction may not be 90°.

It is to be noted that, there are a plurality of bit lines 101 that are arranged at intervals in the base 100. Each bit line 101 may be in contact with at least one first region I. In FIG. 2, for example, there are 4 bit lines 101 that are spaced apart from each other, and each bit line 101 is in contact with 4 first regions I. In practical application, according to electrical requirements, the number of the bit lines 101 and the number of the first region(s) I that are in contact with each bit line 101 may be reasonably designed.

The semiconductor structure is described in more detail below with reference to FIG. 1 to FIG. 4.

In some embodiments, the type of material of the base 100 may be an element semiconductor material or a crystalline inorganic compound semiconductor material. The element semiconductor material may be silicon or germanium. The crystalline inorganic compound semiconductor material may be silicon carbide, silicon germanium, gallium arsenide, or indium gallium.

In some embodiments, referring to FIG. 2 and FIG. 3, the base 100 includes the bit line 101 and the semiconductor channel 102. The base 100, the bit line 101, and the semiconductor channel 102 may have a same semiconductor element. Then, the semiconductor channel 102 and the bit line 101 may be formed by using a same film layer structure. The film layer structure is formed by the semiconductor element, so that the semiconductor channel 102 and the bit line 101 are integrated into one structure. In this way, an interface state defect between the semiconductor channel 102 and the bit line 101 is reduced, so as to improve the electrical properties of the semiconductor structure. The semiconductor element may include at least one of silicon, carbon, germanium, arsenic, gallium, or indium. In the following, it is exemplified with both the bit line 101 and the semiconductor channel 102 including silicon.

In some embodiments, referring to FIG. 2 and FIG. 3, the semiconductor structure further includes a metal semiconductor compound structure 111. The metal semiconductor compound structure is located at least in the bit line 101 directly facing a bottom surface of the insulation layer 106.

Compared with a semiconductor material that is not metallized, the metal semiconductor compound structure 111 has a relatively small resistivity. Therefore, compared with the semiconductor channel 102, the resistivity of the bit line 101 including the metal semiconductor compound structure 111 is smaller, so that the self-resistance of the bit line 101 is reduced, and the contact resistance between the bit line 101 and the semiconductor channel 102 of the first region I is reduced, so as to further improve the electrical properties of the semiconductor structure. In addition, the resistivity of the bit line 101 is also less than the resistivity of the substrate 110.

It is to be noted that, in some embodiments, a material of an area of the bit line 101 right under the first region I may be a semiconductor material, and a material of the part of the area of the bit line 101 that is not covered by the first region I is a metal semiconductor compound. It is to be understood that, with the continuous reduction of the size of a device or the adjustment of manufacturing process parameters, the material of the part of the area of the bit line 101 right under the first region I is the semiconductor material, and the material of the rest of the area of the bit line 101 right under the first region I may be the metal semiconductor compound. A position of "the rest of the area" is at a periphery of "the part of the area".

For example, referring to FIG. 2, a plurality of metal semiconductor compound structures 111 in the bit line 101 are connected to each other to form part of the bit line 101. In addition, part of a metal semiconductor compound structure 111 may be located in the bit line 101, and part of the metal semiconductor compound structure may be located in the semiconductor channel 102 of the first region I. In other embodiments, the plurality of metal semiconductor compound structures in the same bit line may be spaced apart from each other.

In FIG. 2, the area of the base 100 defined by a dashed box similar to an oval shape indicates the metal semiconductor compound structures 111. In practical application, the size of the area that two adjacent metal semiconductor compound structures 111 are in contact with each other is not limited. In other embodiments, the full thickness of a bit line may be the metal semiconductor compound structures 111.

In some embodiments, continuously referring to FIG. 2, for a single metal semiconductor compound structure 111, in directions from the semiconductor channels 102 on two sides of the insulation layer 106 pointing to the insulation layer 106, that is, in C1 and C2 directions, the depth of the metal semiconductor compound structure 111 is gradually increased. Taking the semiconductor element being silicon as an example, the material of the metal semiconductor compound structure 111 includes at least one of cobalt silicide, nickel silicide, molybdenum silicide, titanium silicide, tungsten silicide, tantalum silicide, or platinum silicide.

In some embodiments, the semiconductor channel 102 may have a doped element, which facilitates the enhancement of the conductivity of the semiconductor channel 102. Therefore, a turn-on voltage between the first region I and the third region III can be reduced, that is, the turn-on voltage between the source and the drain in the GAA transistor is reduced. The doped element may be a P-type doped element or an N-type doped element. Specifically, the N-type doped element may be at least one of arsenic, phosphorus, or antimony. The P-type doped element may be at least one of boron, indium, or gallium.

In some embodiments, the GAA transistor may be a junctionless transistor. That is to say, a doped element in the first region I, the second region II, and the third region III is the same type. "Junctionless" means that there is no PN junction, that is, the doped element in the first region I, the second region II, and the third region III has the same doping concentration. Such benefits include: in one aspect, extra doping is not required to be performed on the first region I and the third region III, so that difficulty in control of a doping process of the first region I and the third region III can be prevented, especially as a size of the transistor is further reduced, if extra doping is performed on the first region I and the third region III, the doping concentration is more difficult to be controlled. In the other aspect, since a device is the junctionless transistor, the phenomenon of ultra-steep PN junctions manufactured within a nanoscale range by using an ultra-steep source-drain concentration gradient doping process can be avoided, so that threshold voltage drift and leakage current increase caused by doping mutation can be prevented, and a short channel effect is further inhibited. Therefore, the integration density and the electrical properties of the semiconductor structure can be further improved. It is to be understood that, extra doping here refers to the doping that is performed in order to cause the types of the doped elements to the first region I and the third region III to be different from the type of the doped element to the second region II.

Continuously referring to FIG. 2 and FIG. 3, in a plane perpendicular to a sidewall of the semiconductor channel 102, the semiconductor channel 102 surrounded by the first gate layer 104 has a first cross section, and the semiconductor channel 102 surrounded by the second gate layer 105 has a second cross section. The area of the first cross section is greater than the area of the second cross section. Therefore, the cross-sectional area of the semiconductor channel 102 surrounded by the second gate layer 105 is smaller, which is advantageous to improvement of the control ability of the second gate layer 105 to the semiconductor channel 102, i.e., if a required threshold voltage is smaller, the turn-on or turn-off of the GAA transistor is easier to control; and is also advantageous to compensation of the instability of the control ability of the first gate layer 104 to the semiconductor channel 102 by adjusting the control ability of the second gate layer 105 to the semiconductor channel 102. Therefore, the overall desirable control ability to the semiconductor channel 102 can be guaranteed, thereby improving the overall electrical properties of the semiconductor structure.

In addition, the control abilities of the first gate layer 104 and the second gate layer 105 to the semiconductor channel 102 compensate with each other. One of the gate layers is short of the ability to turn off the semiconductor channel 102, GIDL will be too large. For example, when GIDL occurs, the semiconductor channel 102 is turned off by improving the control ability of the other gate layer, so that the overall desirable control abilities of the first gate layer 104 and the second gate layer 105 to the semiconductor channel 102 are guaranteed. Therefore, the GIDL in the semiconductor structure can be reduced, to improve the overall electrical properties of the semiconductor structure.

A ratio of the area of the first cross section to the area of the second cross section may range from 1.5 to 2.5.

In some embodiments, referring to FIG. 2 and FIG. 3, in the plane perpendicular to the sidewall of the semiconductor channel 102, the cross-sectional area of the semiconductor channel 102 of the first region I, the cross-sectional area of the semiconductor channel 102 of the second region II, and the cross-sectional area of the semiconductor channel 102 of the third region III may decrease in sequence.

Continuously referring to FIG. 2 and FIG. 3, the dielectric layer 103 may include: a first dielectric layer 113, located between two adjacent bit lines 101 and between the first regions I of the semiconductor channels 102 on the adjacent bit lines 101; a second dielectric layer 123, located on the sidewall of a semiconductor channel 102 of the first region I and the sidewall of the first dielectric layer 113 of the first region I; a third dielectric layer 133, surrounding the sidewall of the semiconductor channel 102 of the second region II; and a fourth dielectric layer 143, surrounding the sidewall of the semiconductor channel 102 of the third region III and located on the top surface of the semiconductor channel 102.

The first dielectric layer 113 located between the adjacent bit lines 101 is configured to achieve an electric insulation between the adjacent bit lines 101. The first dielectric layer 113 located between the first regions I of the semiconductor channels 102 on the adjacent bit lines 101, the second dielectric layer 123, and the insulation layer 106 work together to achieve an electric insulation between the first regions I of the semiconductor channels 102 that are spaced in the first direction X and/or in the second direction Y. The third dielectric layer 133 surrounding the sidewall of the second region II of the semiconductor channel 102 may be configured to isolate the first gate layer 104 and the second region II of the semiconductor channel 102. The fourth dielectric layer 143 surrounding the surface of the third region III of the semiconductor channel 102 and the insulation layer 106 work together to achieve the electric insulation between the third regions III of the semiconductor channels 102 that are spaced in the first direction X and/or in the second direction Y.

In some embodiments, the third dielectric layer 133 shown in FIG. 2 may be located on part of the sidewall of the second dielectric layer 123, so that the insulation between the first gate layer 104 and the semiconductor channel 102 is further guaranteed. The fourth dielectric layer 143 may be located on part of a sidewall of the third dielectric layer 133, so that the insulation between the second gate layer 105 and the semiconductor channel 102 is further guaranteed.

In some embodiments, the material of the first dielectric layer 113, the material of the second dielectric layer 123, the material of the third dielectric layer 133, and the material of the fourth dielectric layer 143 shown in FIG. 2 and FIG. 3 may be the same, such as silicon oxide. In other embodiments, the material of the first dielectric layer, the material of the second dielectric layer, the material of the third dielectric layer, and the material of the fourth dielectric layer may be different, as long as the materials have desirable insulation effects.

In some embodiments, referring to FIG. 2 and FIG. 3, the respective cross-sectional areas of the semiconductor channels 102 of the first region I, the second region II, and the third region III are decreased in sequence. In this way, the periphery of the orthographic projection of the fourth dielectric layer 143 on the substrate 110 is within the periphery of the orthographic projection of the third dielectric layer 133 on the substrate 110. The periphery of the orthographic projection of the third dielectric layer 133 on the substrate 110 is within the periphery of the combined orthographic projection of the second dielectric layer 123 and the first dielectric layer 113 on the substrate 110. The first gate layer 104 is located on at least part of the top surface of the first dielectric layer 113 and part of the top surface of the second dielectric layer 123. The second gate layer 105 is located at least on part of the top surface of the third dielectric layer 133. Therefore, the first gate layer 104 is prevented from directly facing the second gate layer 105 in the direction Z. That is to say, it is avoided that the orthographic projection of the first gate layer 104 on the substrate 110 is within the orthographic projection of the second gate layer 105 on the substrate 110. In this way, mutual interference between the first gate layer 104 and the second gate layer 105 is reduced.

In some embodiments, referring to FIG. 2, FIG. 3 and FIG. 4, a single first gate layer 104 extends in the second direction Y, and surrounds an adjacent semiconductor channel 102 on an adjacent bit line 101. A single second gate layer 105 only surrounds the single semiconductor channel 102. The periphery of the orthographic projection of the third dielectric layer 133 on the substrate 110 may coincide with a periphery of the orthographic projection of the second gate layer 105 on the substrate 110. Two adjacent second gate layers 105 are spaced by the insulation layer 106. The material of the first gate layer 104 and the material of the second gate layer 105 may both include at least one of polysilicon, titanium nitride, tantalum nitride, copper, or tungsten.

In some embodiments, referring to FIG. 2 and FIG. 3, a vertical distance between the top surface of the first gate layer 104, which is away from the bit line 101, and the bottom surface of the second gate layer 105, which is close to the bit line 101, may range from 20 nm to 60 nm. In this way, it is advantageous to prevent generation of a relatively large parasitic capacitance generated between the first gate layer 104 and the second gate layer 105. The mutual interference between the first gate layer 104 and the second gate layer 105 is reduced. Therefore, the desirable control abilities of the first gate layer 104 and the second gate layer 105 to the semiconductor channel 102 can be guaranteed.

In some embodiments, referring to FIG. 2, FIG. 3 and FIG. 4, in a direction that the bit line 101 points to the semiconductor channel 102, the length of the first gate layer 104 is greater than the length of the second gate layer 105. Therefore, a larger area of the first gate layer 104 surrounding the semiconductor channel 102 is guaranteed, and the control ability of the first gate layer 104 to the semiconductor channel 102 is enhanced. The ratio of the length of the first gate layer 104 to the length of the second gate layer 105 ranges from 1.5 to 4.

In some embodiments, referring to FIG. 4, in the direction perpendicular to the sidewall of the semiconductor channel 102, the thickness of the first gate layer 104 is greater than the thickness of the second gate layer 105. In this way, the volume of the first gate layer 104 can be increased. Therefore, a small resistance of the first gate layer 104 is guaranteed, to improve the control ability of the first gate layer 104 to the semiconductor channel 102. A ratio of the thickness of the first gate layer 104 to the thickness of the second gate layer 105 ranges from 1.2 to 2.

In some embodiments, the second gate layer 105 shown in FIG. 2, FIG. 3 and FIG. 4 includes zirconium and/or at least one of lanthanide elements. Therefore, the electrical properties of the second gate layer 105 are improved, so as to enhance the control ability of the second gate layer 105 to the semiconductor channel 102. In addition, when the size of the second gate layer 105 is less than the size of the first gate layer 104, the conductivity of the second gate layer 105 is enhanced by doping zirconium and/or at least one of lanthanide elements in the second gate layer 105, so that the difference in conductivity between the first gate layer 104 and the second gate layer 105 due to the size difference can be made up, and the difference between the control abilities of the first gate layer 104 and the second gate layer 105 to the semiconductor channel 102 can be reduced. Therefore, the overall stability of the semiconductor structure can be improved.

In some embodiments, referring to FIG. 2, the insulation layer 106 includes: a first insulation layer 116, located between the dielectric layers 103 of the adjacent semiconductor channels 102 and between the first gate layers 104, and extending in the second direction Y, in which the top surface of the first insulation layer 116 is not lower than the top surface of the third region III; the second insulation layer 126, located on the top surface of the first gate layer 104, and between the first insulation layer 116 and the second gate layer 105; and a third insulation layer 136, located on the top surface of the second gate layer 105, and between the second insulation layer 126 and the dielectric layer 103.

The first insulation layer 116, the second insulation layer 126, and the third insulation layer 136 work together to achieve an electric insulation between two adjacent semiconductor channels 102, an electric insulation between the adjacent first gate layers 104, and an electric insulation between the adjacent second gate layers 105. In addition, the second insulation layer 126 on the top surface of the first gate layer 104 may achieve the electric insulation between the first gate layer 104 and other conductive structures. The third insulation layer 136 on the top surface of the second gate layer 105 may achieve the electric insulation between the second gate layer 105 and other conductive structures.

In some embodiments, the material of the first insulation layer 116, the material of the second insulation layer 126, and the material of the third insulation layer 136 shown in FIG. 2 may be the same, such as silicon nitride. In other embodiments, the material of the first insulation layer, the material of the second insulation layer, and the material of the third insulation layer may be different, as long as the materials have desirable insulation effects. For a same etching process, there is a high etch selectivity between the material of the insulation layer and the material of the dielectric layer.

In some embodiments, referring to FIG. 1 and FIG. 2, the semiconductor structure may further include an electrical contact structure 107. The electrical contact structure is located on part of the surface of the second gate layer 105 away from the bit line 101 and located on part of the surface of the dielectric layer 103 of the third region III. For example, the electrical contact structure 107 may be located on part of the top surface of the second gate layer 105 and the part of the sidewall of the second gate layer 105 extending downward along the part of the top surface, and is further located on part of the top surface of the fourth dielectric layer 143 and the part of the sidewall of the fourth dielectric layer 143 extending downward along the part of the top surface.

The electrical contact structure 107 is configured to control the potential of the second gate layer 105. In some embodiments, a voltage may be directly applied to the second gate layer 105 through the electrical contact structure 107, so that each second gate layer 105 is individually controlled. In other embodiments, a patterned conductive layer (not shown) may be formed to connect different electrical contact structures, so as to control different second gate layers with a same voltage, which in practical application, can improve electrical requirements, and control the number of the electrical contact structures connected in the same conductive layer.

In some embodiments, referring to FIG. 1 and FIG. 2, the semiconductor structure may further include: a barrier layer 108, surrounding the sidewall of each electrical contact structure 107; and a mask layer 118, located between the adjacent barrier layers 108 and covering the exposed top surfaces of the dielectric layers 103 and the top surfaces of the insulation layers 106. The barrier layer 108 may be made of silicon oxide. The mask layer 118 may be made of a photoresist.

To sum up, the sidewall of one single semiconductor channel 102 is surrounded by the first gate layer 104 and the second gate layer 105. The first gate layer 104 and the second gate layer 105 correspond to the same semiconductor channel 102, and respectively control the semiconductor channel 102. Therefore, the control abilities of the first gate layer 104 and the second gate layer 105 to the semiconductor channel 102 compensate with each other. For example, when the first gate layer 104 has a low ability to control the semiconductor channel 102, GIDL may be larger, and then the second gate layer 105 is used to control the semiconductor channel 102 to make up the deficiency, so that the overall desirable control abilities of the first gate layer 104 and the second gate layer 105 to the semiconductor channel 102 are guaranteed. Therefore, the GIDL in the semiconductor structure can be reduced. By adjusting the voltage applied to the first gate layer 104 and the second gate layer 105, the turn-on/turn-off ratio of the semiconductor channel 102 is increased, so that the sensitivity of controlling the turn-on/turn-off ratio of the semiconductor channel 102 is integrally enhanced. Therefore, the overall electrical properties of the semiconductor structure can be improved.

An embodiment of the disclosure further provides a method for manufacturing a semiconductor structure. The method is applicable to the formation of the above semiconductor structure.

FIG. 5 to FIG. 18 are schematic diagrams of cross-sectional structures corresponding to operations of a method for manufacturing a semiconductor structure according to embodiments of the disclosure. The method for manufacturing a semiconductor structure provided in the embodiments of the disclosure is described in detail below with reference to the drawings. The parts that are the same as or correspond to the above embodiments are not described herein again.

It is to be noted that, in order to facilitate the description and clearly illustrate steps of the method for manufacturing a semiconductor structure, FIG. 5 to FIG. 18 are schematic diagrams of local structures of the semiconductor structure. FIG. 6 is a schematic cross-sectional view of the structure shown in FIG. 5 in a first cross-sectional direction AA1. FIG. 7 is a schematic cross-sectional view of the structure shown in FIG. 5 in a second cross-sectional direction BB1. It is to be noted that, one or both of the schematic cross-sectional view in the first cross-sectional direction AA1 and the schematic cross-sectional view in the second cross-sectional direction BB1 will be set forth in the following according to expression requirements.

Figure 5:
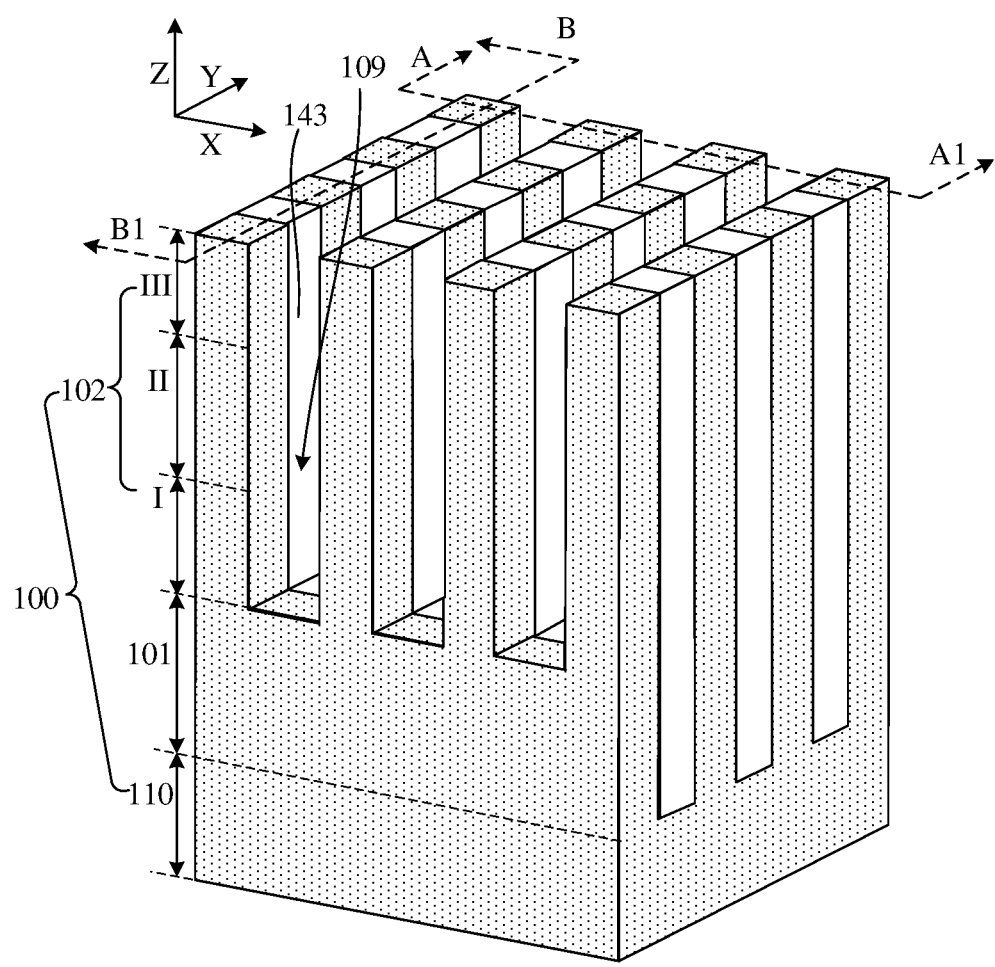
FIG. 5 to FIG. 18 are schematic diagrams of cross-sectional structures corresponding to operations of a method for manufacturing a semiconductor structure according to an embodiment of the disclosure.
Figure 6:
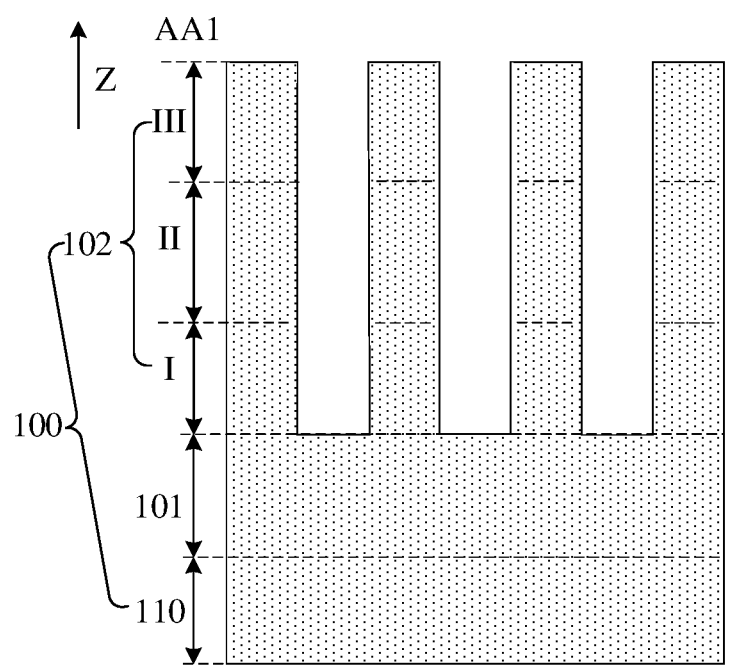
Figure 7:
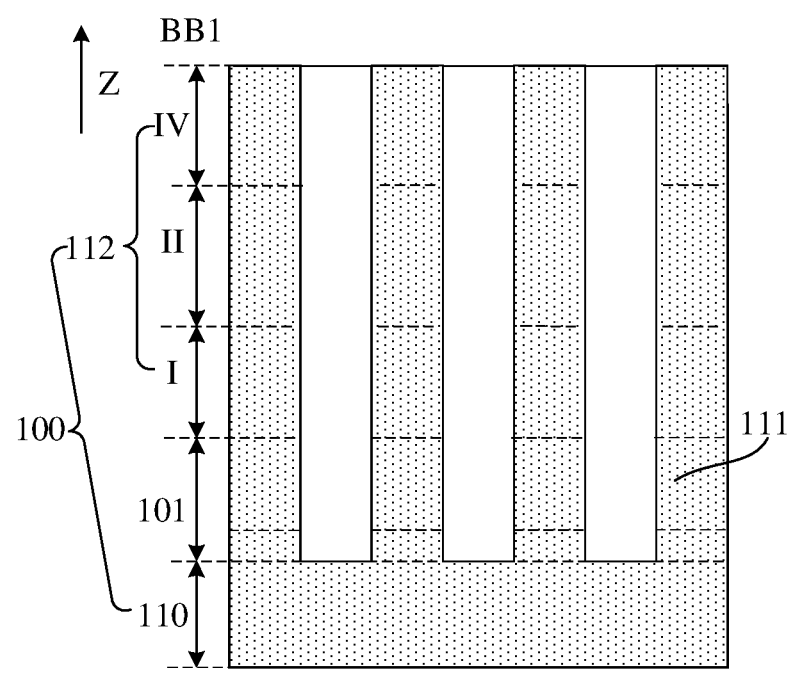

Referring to FIG. 5 to FIG. 7, the method for manufacturing a semiconductor structure includes the following operations. A base 100 is provided, which includes bit lines 101 and semiconductor channels 102 that are respectively arranged at intervals, the bit lines 101 extend in a first direction X, the semiconductor channels 102 are located on partial top surfaces of each bit line 101, and in a direction Z perpendicular to the top surfaces of the bit lines 101, and each semiconductor channel 102 includes a first region I, a second region II, and a third region III that are arranged in sequence. A dielectric layer 103 is formed, in which the dielectric layer 103 is located between two adjacent ones of the bit lines 101 and on a surface of the semiconductor channel 102.

It is to be noted that, the first region I and the third region III may be used as a source or a drain of a subsequently formed GAA transistor having the semiconductor channel 102. A part of the second region II corresponds to a subsequently formed first gate layer 104 of the GAA transistor. A part of the third region III corresponds to a subsequently formed second gate layer 105 of the GAA transistor.

In some embodiments, the operation of providing the base 100 may include the following operations.

An initial base (not shown) is provided. The initial base has initial first dielectric layers (not shown) extending in the first direction X. Referring to FIG. 5 to FIG. 7, the initial base and the initial first dielectric layers are patterned, to form the bit lines 101 and the semiconductor channels 102 that are respectively arranged at intervals, and the initial first dielectric layers located between adjacent bit lines 101. The top surfaces of the initial first dielectric layers are not lower than the top surfaces of the semiconductor channels 102. Grooves 109 are defined by sidewalls of the semiconductor channels 102, sidewalls of the initial first dielectric layer, and partial top surfaces of the bit line s101. The grooves 109 extend in a second direction Y.

The material type of the initial base may be an element semiconductor material or a crystalline inorganic compound semiconductor material. The element semiconductor material may be silicon or germanium. The crystalline inorganic compound semiconductor material may be silicon carbide, silicon germanium, gallium arsenide, or indium gallium. The initial base is the basis for forming the bit lines 101 and the semiconductor channels 102. A substrate 110 is also formed while the initial base and the initial first dielectric layer are patterned to form the bit line 101 and the semiconductor channel 102.

A method for patterning the initial base and the initial first dielectric layer includes the self-aligned quadruple patterning (SAQP) technology or the self-aligned double patterning (SADP) technology.

In some embodiments, doping and annealing may be performed on the initial base, to provide the initial base to be doped with an N-type doped element or a P-type doped element, so that the conductivity of the semiconductor channels 102 that are formed based on the initial base can be improved, thus, a turn-on voltage between the first region I and the third region III can be reduced, that is, a turn-on voltage between the source and the drain in the subsequently formed GAA transistor is reduced. In addition, the conductivity of the bit lines 101 that are formed based on the initial base is improve due to doping the N-type doped element or the P-type doped element into the initial base, so that a contact resistance between the first regions I and the bit lines 101 can be reduced. Therefore, the electrical properties of the semiconductor structure can be improved.

The doped element may be a P-type doped element or an N-type doped element. Specifically, the N-type doped element may be at least one of arsenic, phosphorus, or antimony. The P-type doped element may be at least one of boron, indium, or gallium.

Referring to FIG. 8 to FIG. 18, the method for manufacturing a semiconductor structure further includes the following operations. A first gate layer 104 is formed, which surrounds the dielectric layer 103 of the second region II. A second gate layer 105 is formed, which surrounds the dielectric layer 103 of the third region III, and in the direction Z perpendicular to top surfaces of the bit lines 101, in which the second gate layer 105 is spaced apart from the first gate layer 104. An insulation layer 106 is formed, which is located between two adjacent ones of the semiconductor channels 102 on a same bit line 101.

In some embodiments, referring to FIG. 5, when a groove 109 is defined by the sidewalls of the semiconductor channels 102, the sidewalls of the initial first dielectric layers, and the partial top surfaces of the bit lines 101, the operations of forming the dielectric layer, the first gate layer, the second gate layer, and the insulation layer may include the following steps.

Figure 8:
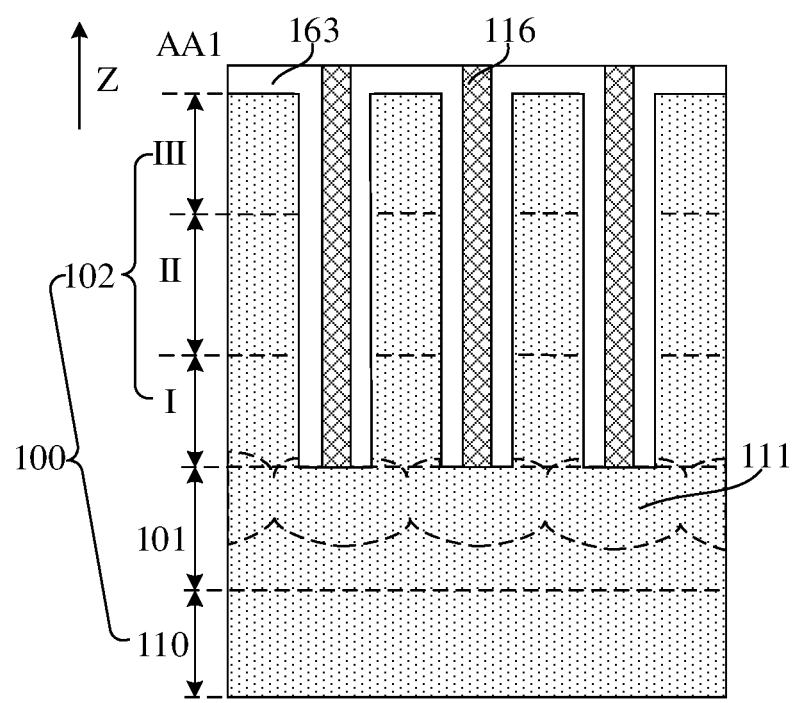
Figure 9:
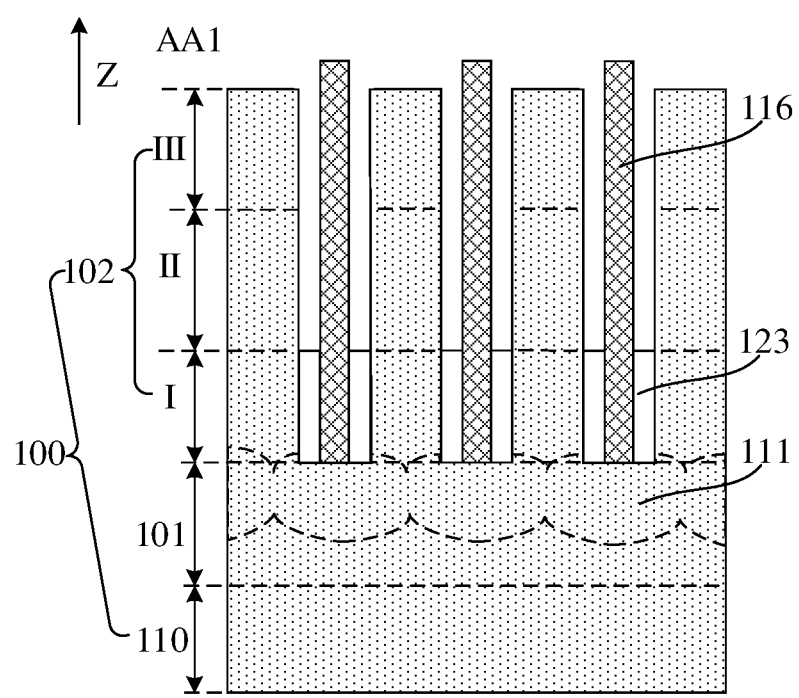
Figure 10:
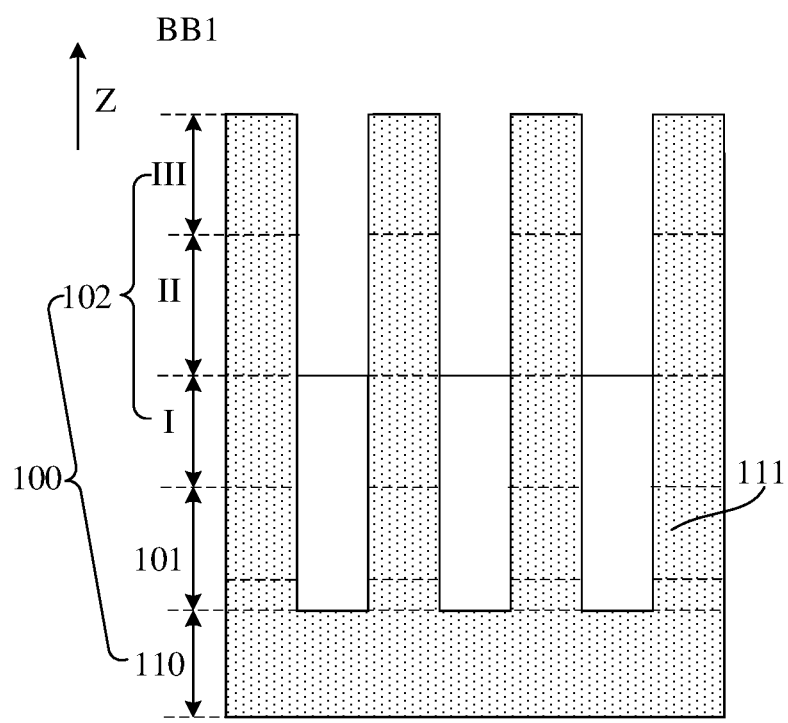

Referring to FIG. 8 to FIG. 10, the first dielectric layer 113 shown in FIG. 3 is formed between two adjacent ones of the bit lines 101 and between the semiconductor channels 102 of the first region I on the adjacent bit lines 101. Second dielectric layers 123 shown in FIG. 2 are formed on sidewalls of a groove 109 of the first region I. A first insulation layer 116 is formed, which is located in the groove 109 and isolates the adjacent second dielectric layers 123. A top surface of the first insulation layer 116 is not lower than top surfaces of the semiconductor channels 102.

The top surface of the first insulation layer 116 is not lower than the top surfaces of the semiconductor channels 102, which is conductive to subsequently form a second gap between the first insulation layer 116 and the semiconductor channels 102 of the second region II and the third region III. Then, the first gate layer and the second gate layer having accurate sizes may be formed in the second gap in a manner of self-alignment, so that the first gate layer and the second gate layer having high size accuracy may be formed without an etching process. This is conductive to simplify the forming processes of the first gate layer and the second gate layer and by adjusting the size of the second gap, the first gate layer and the second gate layer having small sizes can be obtained.

In some embodiments, the operations of forming the first dielectric layer 113, the second dielectric layer 123, and the first insulation layer 116 shown in FIG. 2 and FIG. 3 may include the following operations.

Referring to FIG. 8, initial second dielectric layers 163 are formed on the sidewalls of the groove 109 shown in FIG. 5, and there is a first gap between the adjacent initial second dielectric layers 163. In some embodiments, the initial second dielectric layers 163 may be formed by using the following process operation: performing a deposition process to form the initial second dielectric layers that covers the top surfaces and exposed surfaces of all of sidewalls of the semiconductor channels 102, and also on exposed top surfaces and sidewalls of the initial first dielectric layer, (in which a material of the initial second dielectric layers 163 include silicon oxide.

Continuously referring to FIG. 8, the first insulation layer 116 is formed in the first gap. In some embodiments, the first insulation layer 116 may be formed by using the following process operations. A first insulation film covering top surfaces of the initial second dielectric layers 163 and filled up the first gap is formed. Chemical mechanical planarization is performed on the first insulation film until the initial second dielectric layers 163 are exposed, and the remaining first insulation film is used as the first insulation layer 116. A material of the first insulation layer 116 includes silicon nitride. The material of the initial first dielectric layers is the same as the material of the initial second dielectric layers 163, so that part of the initial first dielectric layer and part of the initial second dielectric layer 163 are subsequently removed in a single removal process, so as to form the second gaps.

In some embodiments, continuously referring to FIG. 8, before the first insulation layer 116 is formed, and after the initial second dielectric layer 163 is formed, metal silicidation is performed on partial part of the top surface of the bit line 101 exposed from the initial second dielectric layers 163, to form a metal semiconductor compound structure 111. Compared with a semiconductor material that is not metallized, the metal semiconductor compound structure 111 has a relatively small resistivity. Therefore, compared with the semiconductor channels 102, the resistivity of the bit lines 101 including the metal semiconductor compound structures 111 is smaller, so that the self-resistance of the bit lines 101 is reduced, and the contact resistance between the bit lines 101 and the semiconductor channels 102 of the first region I is reduced, so as to further improve the electrical properties of the semiconductor structure.

In some embodiments, referring to FIG. 8, the operation of performing the metal silicidation on the part of the top surface of the bit line 101 exposed from the initial second dielectric layers 163 may include: forming a metal layer (not shown) on the exposed top surface of the bit line 101. The metal layer provides a metal element for the metal semiconductor compound structure 111. A material of the metal layer includes at least one of cobalt, nickel, molybdenum, titanium, tungsten, tantalum, or platinum. In other embodiments, the metal silicidation may not be performed on the exposed top surface of the bit line, and the first insulation layer may be directly formed on the exposed top surface of the bit line.

Referring to FIG. 8 and FIG. 9 to FIG. 10, the method for manufacturing a semiconductor structure further includes the operation that the initial first dielectric layers and the initial second dielectric layers 163 are etched by using the first insulation layer 116 as a mask, to form the first dielectric layer 113 and the second dielectric layer 123.

Referring to FIG. 11 to FIG. 18, the method for manufacturing a semiconductor structure further includes the following operations. A third dielectric layer 133 and the first gate layer 104 are formed on a sidewall of the groove 109 shown in FIG. 5 of the second region II, in which a top surface of the third dielectric layer 133 is higher than the top surface of the first gate layer 104. A second insulation layer 126 is formed, which is located between the first insulation layer 116 and the third dielectric layer 133. A fourth dielectric layer 143 and the second gate layer 105 are formed on the sidewall of the groove 109 of the third region III, in which a top surface of the fourth dielectric layer 143 is higher than a top surface of the second gate layer 105. A third insulation layer 136 is formed, which is located between the second insulation layer 126 and the fourth dielectric layer 143. The dielectric layer 103 is constituted by the first dielectric layer 113, the second dielectric layer 123, the third dielectric layer 133 and the fourth dielectric layer 143. The insulation layer 106 is constituted by the first insulation layer 116, the second insulation layer 126 and the third insulation layer 136.

In some embodiments, the operation of forming the third dielectric layer 133, the first gate layer 104, and the second insulation layer 126 shown in FIG. 2 and FIG. 3 may include the following step.

Figure 11:
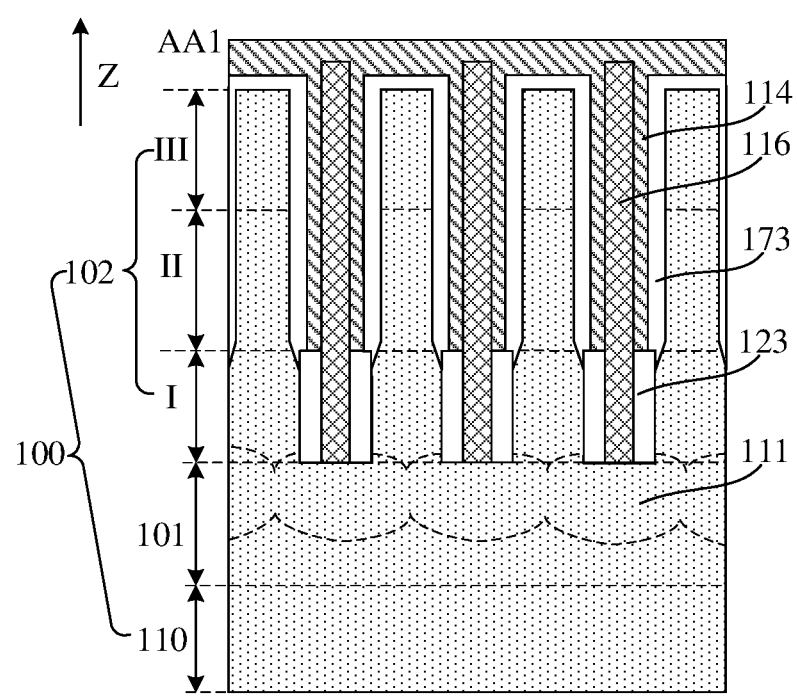
Figure 12:
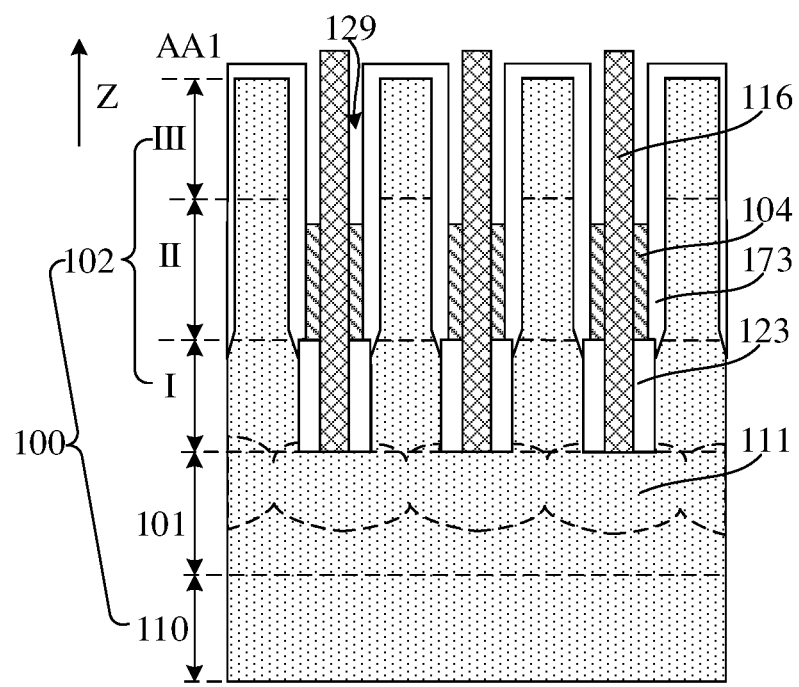
Figure 13:
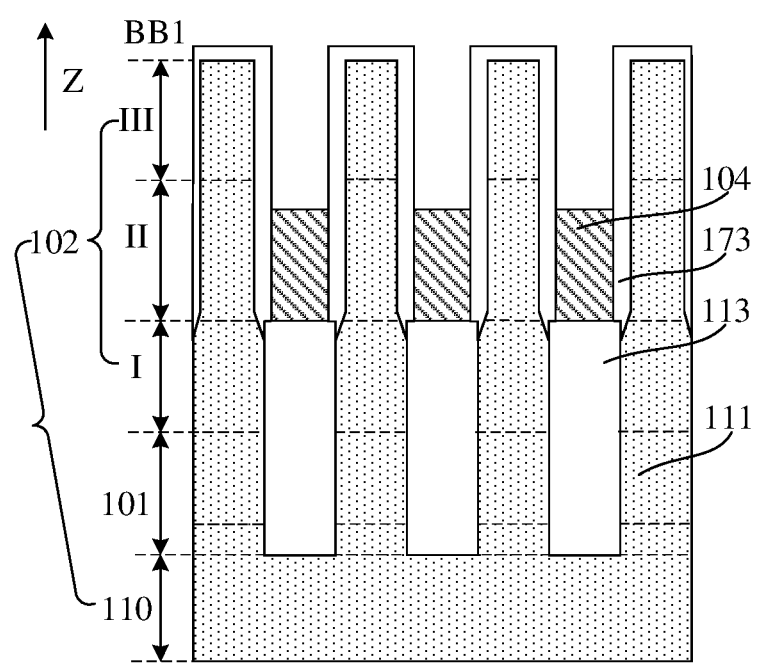

Referring to FIG. 11 to FIG. 13, an initial third dielectric layer 173 is formed on a sidewall of a semiconductor channel 102 of the second region II and the third region III. There is the second gap 129 between the initial third dielectric layer 173 and the first insulation layer 116. In some embodiments, the initial third dielectric layer 173 may be formed by using the following process operation. Thermal oxidation is performed on the exposed surface of the semiconductor channel 102 of the second region II and the third region III, to form the initial third dielectric layer 173. A material of the initial third dielectric layer 173 includes silicon oxide. In other embodiments, the initial third dielectric layer covering the surface of the semiconductor channel of the second region and the third region may also be formed through a deposition process.

Referring to FIG. 12 and FIG. 13, the first gate layer 104 is formed in the second gap 129 of the second region II. The operation of forming the first gate layer 104 may include the following operations. Referring to FIG. 11 and FIG. 12, an initial first gate layer 114 is formed, which is fully filled in the second gap 129 and is located on a top surface of the initial third dielectric layer 173. The initial first gate layer 114, which surrounds the sidewall of the semiconductor channel 102 of the third region III, and part of the sidewall of the semiconductor channel 102 of the second region II, and is located on the top surface of the initial third dielectric layer 173, is removed by etching, and the remaining initial first gate layer 114 is used as the first gate layer 104. In this way, the first gate layer 104 only surrounds part of the sidewall of the semiconductor channel 102 of the second region II.

Figure 14:
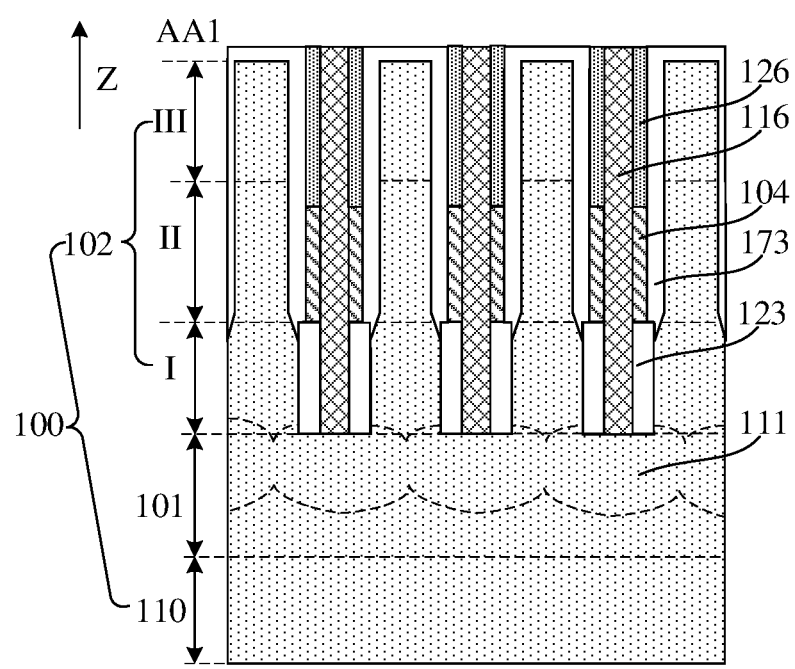

Referring to FIG. 12 and FIG. 14, the second insulation layer 126 is formed in the remaining second gap 129. In some embodiments, the second insulation layer 126 may be formed by using the following process operations. A deposition process is performed to form a second insulation film that is fully filled in the remaining second gap 129 (referring to FIG. 12) and covers the top surface of the initial third dielectric layer 173. Chemical mechanical polishing is performed on the second insulation film and the first insulation layer 116 until the initial third dielectric layer 173 is exposed, and the remaining second insulation film is used as the second insulation layer 126. A material of the second insulation film includes silicon nitride.

Figure 15:
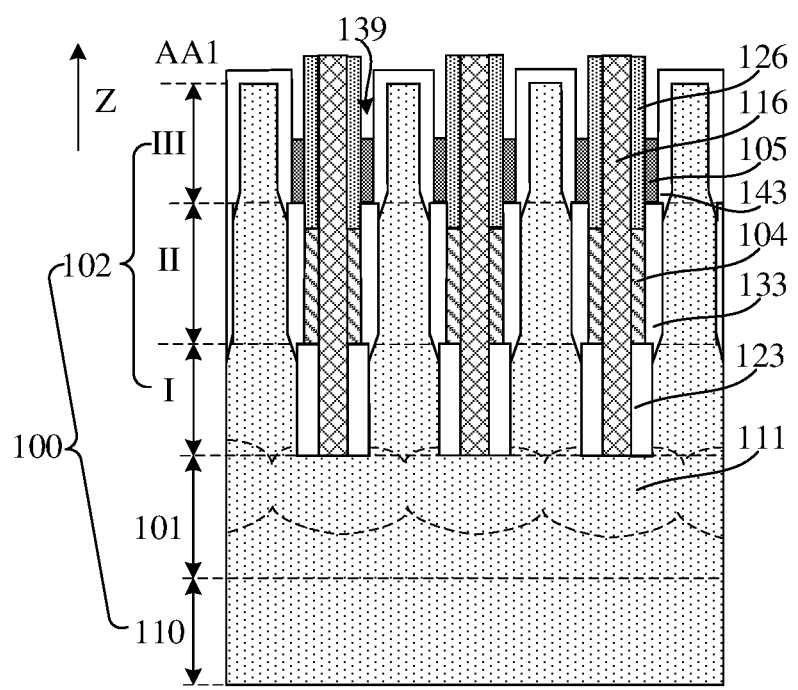

Referring to FIG. 14 and FIG. 15, the initial third dielectric layers 173 are etched by taking the second insulation layer 126 as a mask, to form the third dielectric layer 133. In the operation of forming the third dielectric layer 133, not only the top surfaces of the semiconductor channels 102 are exposed, but also the sidewalls of the semiconductor channels 102 of the third region III are exposed, to prepare for the follow-up formation of the fourth dielectric layer and the second gate layer. In some embodiments, in the direction Z, a depth of the initial third dielectric layer 173 to be etched may range from 10 nm to 30 nm.

In some embodiments, the operation of forming the fourth dielectric layer 143, the second gate layer 105, and the third insulation layer 136 shown in FIG. 2 and FIG. 3 may include the following operations.

Continuously referring to FIG. 15, the fourth dielectric layer 143 is formed on the sidewall of the third region III, and there is a third gap 139 between the fourth dielectric layer 143 and the second insulation layer 126. The second gate layer 105 is formed in part of the third gap 139. In some examples, the fourth dielectric layer 143 is also formed on the top surface of the third region III. The fourth dielectric layer 143 may be formed by using the following process operation. Thermal oxidation is performed on the surface of the semiconductor channel 102 of the third region III, to form the fourth dielectric layer 143. A material of the fourth dielectric layer 143 includes silicon oxide. In other embodiments, the fourth dielectric layer covering the surface of the semiconductor channel of the third region may also be formed with a deposition process.

The operation of forming the second gate layer 105 may include the following operations. An initial second gate layer (not shown) is formed, which is fully filled in the third gap 139 and is located on a top surface of the fourth dielectric layer 143. The initial second gate layer surrounding part of the sidewall of the semiconductor channel 102 of the third region III and located on the top surface of the fourth dielectric layer 143 is removed by etching, and the remaining initial second gate layer is used as the second gate layer 105. In this way, the second gate layer 105 only surrounds part of the sidewall of the semiconductor channel 102 of the third region III.

Figure 17:
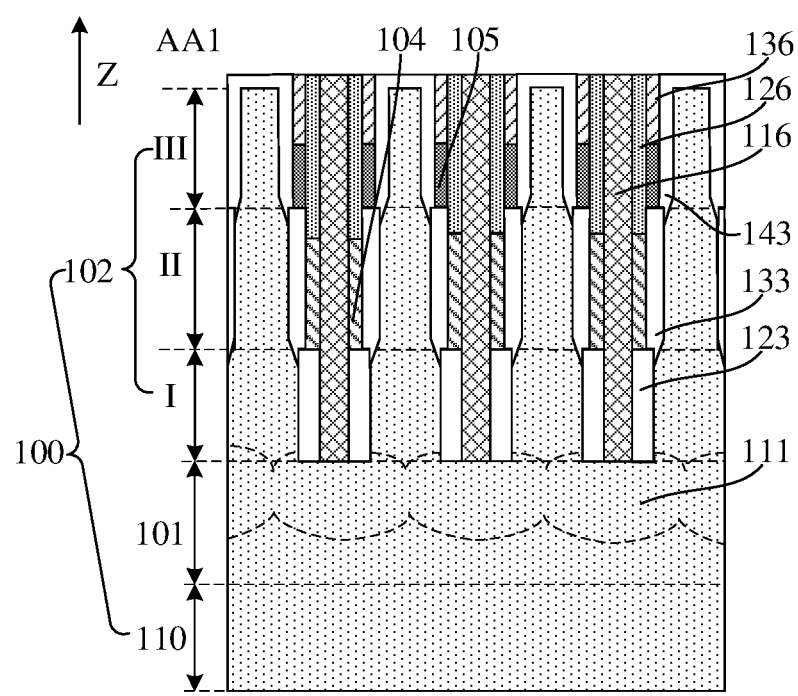

Referring to FIG. 17, the third insulation layer 136 is formed in the remaining third gap 139 (referring to FIG. 15). In some embodiments, the third insulation layer 136 may be formed by using the following process operations. A deposition process is performed to form a third insulation film that is fully filled in the remaining third gap 139 and covers the top surface of the fourth dielectric layer 143. Chemical mechanical polishing is performed on the third insulation film and the first insulation layer 116 until the fourth dielectric layer 143 is exposed, and the remaining third insulation film is used as the third insulation layer 136. A material of the third insulation layer 136 may be silicon nitride.

In some embodiments, referring to FIG. 2 and FIG. 3, after the second gate layer 105 is formed, and before the third insulation layer 136 is formed, the manufacturing method may further include doping at least one of lanthanide elements and/or zirconium in the second gate layer 105. Therefore, the electrical properties of the second gate layer 105 are improved, so as to enhance the control ability of the second gate layer 105 to the semiconductor channel 102. In addition, when the size of the second gate layer 105 is less than the size of the first gate layer 104, the conductivity of the second gate layer 105 is enhanced by doping lanthanide and/or zirconium in the second gate layer 105, so that a conductivity difference between the first gate layer 104 and the second gate layer 105 due to the size difference can be made up, and a difference between the control abilities of the first gate layer 104 and the second gate layer 105 to the semiconductor channel 102 can be reduced. Therefore, the overall stability of the semiconductor structure can be enhanced.

Figure 16:
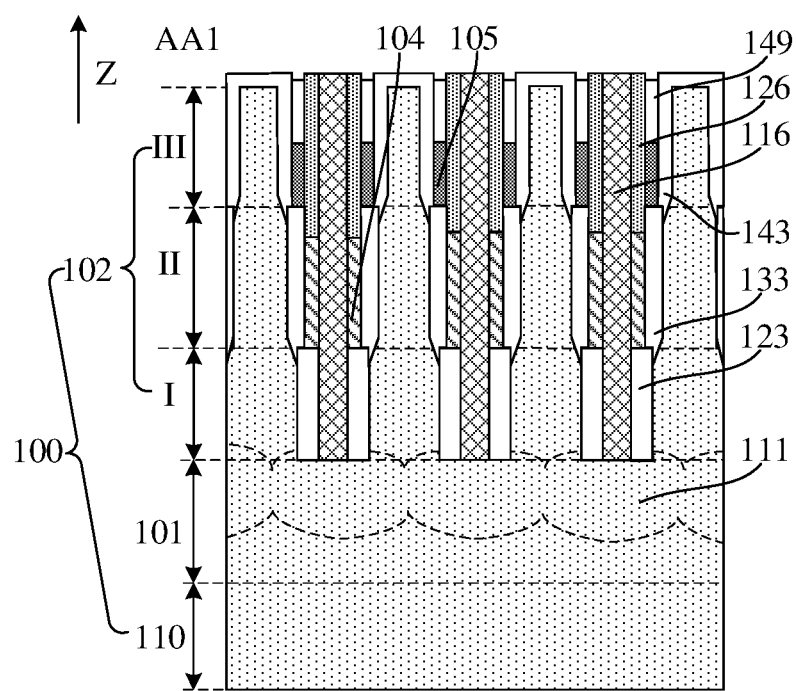

Doping at least one of lanthanide elements and/or zirconium in the second gate layer 105 may use the following operations. Referring to FIG. 16, a diffusion layer 149 is formed in the remaining third gap 139 (referring to FIG. 15). Then a temperature of an environment where the semiconductor structure is located is elevated. A metal element is doped into the second gate layer 105 by means of thermal diffusion of the metal element in the diffusion layer 149. It is to be noted that, a doping depth of the metal element into the second gate layer 105 increases with the elevation of the temperature of the environment where the semiconductor structure is located. A material of the diffusion layer 149 may be at least one of oxides of lanthanide elements such as lanthanum oxide, scandium oxide or cerium oxide, or zirconia.

After the process of doping the at least one of lanthanide elements and/or zirconium in the second gate layer 105 ends, the remaining diffusion layer 149 is removed to expose the second gate layer 105, so as to prepare for the formation of the third insulation layer 136 on the top surface of the second gate layer 105.

In some embodiments, referring to FIG. 18 and FIG. 1 to FIG. 4, after the third insulation layer 136 is formed, the manufacturing method may further include: patterning the insulation layer 106 to expose the second gate layer 105, and forming a through via 159; and forming an electrical contact structure 107 in the through via 159.

Figure 18:
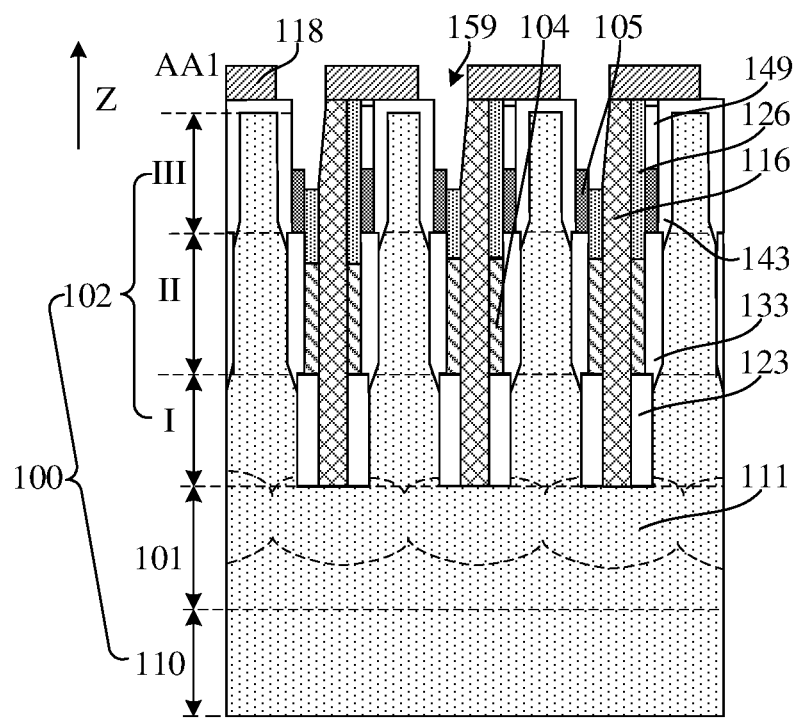

In some embodiments, the operation of forming the electrical contact structure 107 may include the following operation. Referring to FIG. 2, FIG. 3, and FIG. 18, a mask layer 118 having an opening is formed on a top surface that is jointly constituted by the insulation layer 106 and the fourth dielectric layer 143, and in the direction Z, part of the opening directly faces part of the second gate layer 105. Therefore, when the mask layer 118 is used as a mask to etch the insulation layer 106, part of the second gate layer 105 is exposed, to form the through via 159. It is to be noted that, referring to FIG. 2, after the through via 159 is formed, and before the electrical contact structure 107 is formed, a barrier layer 108 may further be formed on a sidewall of the through via 159. The material of the barrier layer 108 may be silicon oxide. The material of the mask layer 118 may be a photoresist.

To sum up, the second gap 129 is formed between the first insulation layer 116 and the semiconductor channel 102 of the second region II and the third region III. The first gate layer 104 and the second gate layer 105 having accurate sizes are formed in the second gap 129 in a manner of self-alignment, so that the first gate layer 104 and the second gate layer 105 having high size accuracy can be formed without a etching process. By adjusting the size of the second gap 129, the first gate layer 104 and the second gate layer 105 having small sizes may be obtained. In addition, the first gate layer 104 and the second gate layer 105 are formed at different regions on the sidewall of the same semiconductor channel 102, so that the control abilities of the first gate layer 104 and the second gate layer 105 to the semiconductor channel 102 compensate with each other. In this way, the overall desirable control abilities of the first gate layer 104 and the second gate layer 105 to the semiconductor channel 102 are guaranteed. Therefore, the GIDL in the semiconductor structure can be reduced, thereby improving the overall electrical properties of the semiconductor structure.

Those of ordinary skill in the art may understand that the above embodiments are specific examples for realizing the disclosure, and in practical application, various changes may be made in form and details without departing from the spirit and the scope of the disclosure. Any person skilled in the art may make respective changes and modifications without departing from the spirit and scope of the disclosure. Therefore, the protection scope of the disclosure should be subject to the scope defined by the claims.

INDUSTRIAL APPLICABILITY

Embodiments of the disclosure provide a semiconductor structure and a method for manufacturing the same. The semiconductor structure includes: a base, including bit lines and semiconductor channels that are respectively arranged at intervals, in which the bit lines extends in a first direction, the semiconductor channels are located on partial top surface of the bit lines, and in a direction perpendicular to top surfaces of the bit lines, each semiconductor channel includes a first region, a second region, and a third region that are arranged in sequence; dielectric layers, located between two adjacent ones of the bit lines and on surface of semiconductor channels; a first gate layer, surrounding the dielectric layer of the second region and extending in a second direction, in which the first direction is different from the second direction; a second gate layer, surrounding the dielectric layer of the third region, in which, in the direction perpendicular to the top surface of the bit lines, the second gate layer is spaced apart from the first gate layer; and an insulation layer, located between two adjacent ones of the semiconductor channels on a same bit line and isolating the first gate layers and the second gate layers respectively located on two adjacent ones of the dielectric layers.

In the above technical solution, vertical GAA transistors are formed in the base, and the bit lines are embedded into the base and located under the semiconductor channels, so that a 3D stacked semiconductor structure is formed. The transistors have an arrangement mode of 4F2 to increase the integration density of the semiconductor structure. In addition, the first gate layer and the second gate layer are designed to respectively control the same semiconductor channel, so that the control abilities of the first gate layer and the second gate layer to the semiconductor channel compensate with each other. When one of the gate layers has a low ability to control the semiconductor channel, gate-induced drain leakage (GIDL) will be larger, so that the other gate layer is used to control the semiconductor channel to make up the deficiency. In this way, the overall desirable control abilities of the first gate layer and the second gate layer to the semiconductor channel are guaranteed. Therefore, GIDL in the semiconductor structure can be reduced, thereby improving the overall electrical properties of the semiconductor structure.

The invention claimed is:
1. A semiconductor structure, comprising:
a base, comprising bit lines and semiconductor channels that are respectively arranged at intervals, wherein a bit line extends in a first direction, a semiconductor channel is located on partial top surface of the bit line, and in a direction perpendicular to the top surface of the bit line, and the semiconductor channel comprises a first region, a second region and a third region arranged in sequence;

a dielectric layer, located between two adjacent ones of the bit lines and on a surface of the semiconductor channel;

a first gate layer, surrounding the dielectric layer of the second region and extending in a second direction, wherein the first direction is different from the second direction;

a second gate layer, surrounding the dielectric layer of the third region, wherein, in the direction perpendicular to the top surface of the bit line, the second gate layer is spaced apart from the first gate layer; and an insulation layer, located between two adjacent ones of the semiconductor channels on the same bit line and isolating the first gate layers and the second gate layers on two adjacent ones of the dielectric layers;

wherein, the single first gate layer extends in the second direction, and surrounds two adjacent ones of the semiconductor channels respectively located on two adjacent ones of the bit lines; and the single second gate layer only surrounds the single semiconductor channel.

2. The semiconductor structure of claim 1, wherein, in a plane perpendicular to a sidewall of the semiconductor channel, the semiconductor channel surrounded by the first gate layer has a first cross section, the semiconductor channel surrounded by the second gate layer has a second cross section;

and an area of the first cross section is greater than an area of the second cross section;

wherein, in a direction from the bit line pointing to the semiconductor channel, a length of the first gate layer is greater than a length of the second gate layer; and/or wherein, in a direction perpendicular to a sidewall of the semiconductor channel, a thickness of the first gate layer is greater than a thickness of the second gate layer.

3. The semiconductor structure of claim 1, wherein the second gate layer comprises zirconium and/or at least one of lanthanide elements.

4. The semiconductor structure of claim 1, further comprises an electrical contact structure, located on a surface of the second gate layer away from the bit line and located on part of a surface of the dielectric layer of the third region.

5. The semiconductor structure of claim 1, further comprising a metal semiconductor compound structure, located at least in the bit line directly facing a bottom surface of the insulation layer.

6. The semiconductor structure of claim 5, wherein, in directions from the semiconductor channels on two sides of the insulation layer pointing to the insulation layer, a depth of the metal semiconductor compound structure is gradually increased.

7. The semiconductor structure of claim 1, wherein, in a plane perpendicular to a sidewall of the semiconductor channel, a cross-sectional area of the semiconductor channel of the first region, a cross-sectional area of the semiconductor channel of the second region, and a cross-sectional area of the semiconductor channel of the third region are decreased in sequence.

8. The semiconductor structure of claim 7, wherein the dielectric layer comprises:

a first dielectric layer, located between the adjacent bit lines and between the first regions of the semiconductor channels respectively on the adjacent bit lines;

a second dielectric layer, located on a sidewall of the semiconductor channel of the first region and a sidewall of the first dielectric layer of the first region;

a third dielectric layer, surrounding the sidewall of the semiconductor channel of the second region; and a fourth dielectric layer, surrounding the sidewall of the semiconductor channel of the third region and located on a top surface of the semiconductor channel.

9. The semiconductor structure of claim 8, wherein the first gate layer is at least located on part of a top surface of the first dielectric layer and part of a top surface of the second dielectric layer; and the second gate layer is at least located on part of a top surface of the third dielectric layer.

10. The semiconductor structure of claim 1, wherein the insulation layer comprises:

a first insulation layer, located between the dielectric layers and between the first gate layers of two adjacent ones of the semiconductor channels, and extending in the second direction, wherein a top surface of the first insulation layer is not lower than a top surface of the third region;

a second insulation layer, located on a top surface of the first gate layer, and between the first insulation layer and the second gate layer; and a third insulation layer, located on a top surface of the second gate layer, and between the second insulation layer and the dielectric layer.

11. A method for manufacturing a semiconductor structure, comprising:

providing a base, comprising bit lines and semiconductor channels that are respectively arranged at intervals, wherein a bit line extends in a first direction, a semiconductor channel is located on partial top surface of the bit line, and in a direction perpendicular to a top surface of the bit line, the semiconductor channel comprises a first region, a second region, and a third region arranged in sequence;

forming a dielectric layer, wherein the dielectric layer is located between two adjacent ones of the bit lines and on a surface of the semiconductor channel;

forming a first gate layer, wherein the first gate layer surrounds the dielectric layer of the second region;

forming a second gate layer, wherein the second gate layer surrounds the dielectric layer of the third region and in the direction perpendicular to the top surface of the bit line, and the second gate layer is spaced apart from the first gate layer; and forming an insulation layer, wherein the insulation layer is located between two adjacent ones of the semiconductor channels on the same bit line;

wherein, the single first gate layer extends in the second direction, and surrounds two adjacent ones of the semiconductor channels respectively located on two adjacent ones of the bit lines; and the single second gate layer only surrounds the single semiconductor channel.

12. The method for manufacturing according to claim 11, wherein
providing the base comprises:
providing an initial base, wherein initial first dielectric layers extending in the first direction are provided in the initial base; and
patterning the initial base and the initial first dielectric layers, to form the bit lines and the semiconductor channels that are respectively arranged at intervals, and the initial first dielectric layers located between adjacent bit lines, wherein top surfaces of the initial first dielectric layers are not lower than top surfaces of the semiconductor channels; grooves are defined by sidewalls of the semiconductor channels, sidewalls of the initial first dielectric layers, and partial top surfaces of the bit lines; and the grooves extend in a second direction.

13. The method for manufacturing of claim 12, wherein forming the dielectric layer, the first gate layer, the second gate layer and the insulation layer comprises:
forming a first dielectric layer between the two adjacent bit lines and between the first regions of the semiconductor channels respectively on the two adjacent bit lines;
forming second dielectric layers on sidewalls of a groove of the first region;
forming a first insulation layer, wherein the first insulation layer is located in the groove and isolates the adjacent second dielectric layers, and a top surface of the first insulation layer is not lower than a top surface of the semiconductor channel;
forming a third dielectric layer and the first gate layer on a sidewall of the groove of the second region, wherein a top surface of the third dielectric layer is higher than a top surface of the first gate layer;
forming a second insulation layer, wherein the second insulation layer is located between the first insulation layer and the third dielectric layer;
forming a fourth dielectric layer and the second gate layer on the sidewall of the groove of the third region, wherein a top surface of the fourth dielectric layer is higher than a top surface of the second gate layer; and
forming a third insulation layer, wherein the third insulation layer is located between the second insulation layer and the fourth dielectric layer; and wherein the first dielectric layer, the second dielectric layer, the third dielectric layer and the fourth dielectric layer together constitute the dielectric layer; and the first insulation layer, the second insulation layer and the third insulation layer together constitute the insulation layer.

14. The method for manufacturing of claim 13, wherein the step of forming the first dielectric layer, the second dielectric layer and the first insulation layer comprises:
forming initial second dielectric layers on the sidewalls of the groove, wherein a first gap is provided between the adjacent initial second dielectric layers;
forming the first insulation layer in the first gap; and
etching the initial first dielectric layers and the initial second dielectric layers by using the first insulation layer as a mask, to form the first dielectric layer and the second dielectric layer.

15. The method for manufacturing of claim 14, wherein, before the first insulation layer is formed, and after the initial second dielectric layer is formed, metal silicidation is performed on part of the top surface of the bit line exposed from the initial second dielectric layers, to form a metal semiconductor compound structure.

16. The method for manufacturing of claim 13, wherein forming the third dielectric layer, the first gate layer and the second insulation layer comprises:
forming an initial third dielectric layer on the sidewall of the semiconductor channel of the second region and the third region, wherein a second gap is provided between the initial third dielectric layer and the first insulation layer;
forming the first gate layer in part of the second gap of the second region;
forming the second insulation layer in the remaining second gap; and
etching the initial third dielectric layer by using the second insulation layer as a mask, to form the third dielectric layer.

17. The method for manufacturing of claim 13, wherein forming the fourth dielectric layer, the second gate layer and the third insulation layer comprises:
forming the fourth dielectric layer on the sidewall of the third region, wherein a third gap is provided between the fourth dielectric layer and the second insulation layer;
forming the second gate layer in part of the third gap; and
forming the third insulation layer in the remaining third gap.

18. The method for manufacturing of claim 17, wherein, after the second gate layer is formed, and before the third insulation layer is formed, the method further comprises doping zirconium and/or at least one of lanthanide elements in the second gate layer.

19. The method for manufacturing according to claim 12, further comprising
forming an electrical contact structure, which comprises:
patterning the insulation layer to expose the second gate layer to form a through via; and
forming the electrical contact structure in the through via.

* * * * *